United States Patent [19]

Schiffman

[11] 4,119,484

[45] Oct. 10, 1978

[54] METHOD FOR PRODUCING A DESIGN ON A FLAT OR ARCUATE SURFACE

[75] Inventor: Murray M. Schiffman, Westport, Conn.

[73] Assignee: MBI, Inc., Westport, Conn.

[21] Appl. No.: 757,505

[22] Filed: Jan. 7, 1977

Related U.S. Application Data

[63] Continuation-in-part of Ser. No. 733,711, Oct. 18, 1976, and Ser. No. 729,764, Oct. 5, 1976.

[51] Int. Cl.$^2$ ............................................. B44C 1/22
[52] U.S. Cl. ................................... 156/659; 156/645; 355/49; 355/77
[58] Field of Search ................ 156/654, 58, 659, 645; 355/27, 43, 45, 47, 49, 51, 66, 77; 96/37, 36.2, 38.2, 46; 353/79, 121, 46

[56] References Cited

U.S. PATENT DOCUMENTS

| | | | |
|---|---|---|---|
| 1,658,509 | 2/1928 | Beebe | 96/37 X |
| 2,439,055 | 4/1948 | Pratt et al. | 355/49 |
| 3,263,079 | 7/1966 | Mertz et al. | 355/77 X |
| 3,314,329 | 4/1967 | Wolbert | 355/47 X |

Primary Examiner—William A. Powell
Attorney, Agent, or Firm—Cooper, Dunham, Clark, Griffin & Moran

[57] ABSTRACT

Method and apparatus for producing a design on a flat or arcuate image surface by projecting from a rectangularly disposed design and etching and/or selective plating. The design is transferred to the image surface by passing radially columnated light through a rectangular transparency bearing the design and formed into a cylinder and then redirecting the columnated light such that all areas of the design are projected upon and received by corresponding areas of the image surface which is or has been photosensitized. The design appears on a flat image surface in a foreshortened circular form, and is adapted for subsequent formation into an arcuate surface bearing the design in undistorted form. The design also may be projected directly upon an arcuate image surface in undistorted form.

13 Claims, 6 Drawing Figures

METHOD FOR PRODUCING A DESIGN ON A FLAT OR ARCUATE SURFACE

CROSS-REFERENCE

This application is a continuation-in-part of applicant's co-pending applications, Ser. No. 733,711, filed Oct. 18, 1976, entitled "Method and Apparatus for Producing a Design on a Flat Surface Adapted to be Formed into an Arcuate Surface," and Ser. No. 729,764, filed Oct. 5, 1976, entitled "Method and Apparatus for Producing a Design on an Arcuate Surface," which are hereby incorporated by reference.

BACKGROUND OF THE INVENTION

The present invention relates to the production of a design on a flat, arcuate or irregular, non-flat surface. More particularly, the invention relates to method and apparatus for transferring a flat rectangular design onto an image surface, either in a foreshortened circular form on a flat image surface for subsequent formation into an arcuate surface bearing the design in relatively undistorted form, or directly on an arcuate surface.

Multi-colored metal designs have been produced on flat surfaces using conventional photographic masking techniques to allow successive selective etching and/or metal deposition corresponding to each color effected, as in U.S. Pat. No. 2,731,333 to Ko. Such surfaces can then be curved or pressed into a desired shape, such as in U.S. Pat. No. 3,503,815 to Johnson. However, this procedure is limited by the extent to which an arcuate surface can be formed without excessive distortion of the design, which would usually be in a flat rectangular-coordinate form.

It is known to applicant to transfer a flat design directly to an arcuate surface by use of a projection and rotation technique, as in applicant's co-pending application, Ser. No. 729,764, filed Oct. 5, 1976, entitled "Method and Apparatus for Producing a Design on an Arcuate Surface." It is further known to applicant to transfer a flat design to a flat surface in foreshortened, polar-coordinate form, and then to form the flat surface into an arcuate surface without any apparent distortion, as in applicant's co-pending application, Ser. No. 733,711, filed Oct. 18, 1976, entitled "Method and Apparatus for Producing a Design on a Flat Surface Adapted to be Formed into an Arcuate Surface." In the first of these methods, subsequent processing takes place on the preformed surface. Accordingly, additional hand labor and equipment are necessary if a manufacturer has been equipped to further process only flat surfaces. In the second of these methods, the flat surface must be reformed after processing first takes place on the flat surface. Both of these methods utilize synchronized motion of the object and the image surface. Both methods produce similar results to those intended herein. The present method is an alternative which does not require synchronization of movement of the transparency and image surface.

SUMMARY OF THE INVENTION

It is a primary object of this invention to provide a method of reproducing a flat rectangular-coordinate design on an arcuate surface with minimum distortion. It is another object of the invention to provide a method of transferring a design from a flat rectangular-coordinate form to a flat polar-coordinate form, or alternatively to a radially disposed rectangular-coordinate design on an arcuate surface. It is still another object of this invention to provide a useful means for producing an etched and/or multi-finished foreshortened circular design in a readily repeatable manner as for a production run on each of many flat pieces for subsequent formation into arcuate shapes. A further object is to provide apparatus for readily producing designs conforming to differently shaped surfaces and/or in different proportions, as for a set, or prototypes, or custom or sample items. It is a further object to provide a method for the successive application of a resist-coat on a flat or arcuate surface corresponding to the finish-separated patterns of a multi-finished design so as to allow successive corresponding etching and/or superimposition of different metals or other coatings by conventional means to reproduce such a design on such surface directly or for subsequent formation into an arcuate surface bearing such design without apparent distortion.

The method of the present invention provides a means to generate design patterns either on a set of registerable masks or directly onto a formable flat surface or arcuate surface. In one form of the invention, transference is achieved by projection of rectangular portions of the design pattern onto corresponding radial portions or segments of a flat mask or surface. Columnated light is passed through a rectangular transparency bearing the original design and formed into a cylinder. The columnated light is then redirected by means of a conical mirror through a lens such that the transverse portions of the design are projected upon and received by corresponding radial portions of the flat surface, which is or has been photosensitized. The flat surface is then processed as necessary and formed into an arcuate shape bearing the design in relatively undistorted form. In another form of the invention, the redirected light is again redirected by means of conical mirrors such that the transverse portions of the design are projected directly upon and received by corresponding transverse portions of an arcuate surface.

In the apparatus of the invention, a design in a flat rectangular form, i.e. rectangular-coordinate form and created upon a transparency is formed into a cylindrical shape and held upon a supporting surface. Radially columnated light is passed through the transparency such that all transverse images of the design are projected simultaneously. A conical mirror, aligned with and whose axis coincides with the axis of the cylindrical transparency, redirects the radially columnated light through a projection lens, such that the transverse images are projected upon and received simultaneously by corresponding radial portions of the flat surface in foreshortened circular form, i.e. polar-coordinate form. The mask or surface is maintained perpendicular to the projected transverse areas with its center coincident with the axis of the cylindrical transparency. After exposure, the coating is fixed and the unexposed portion dissolved. The latter area of the surface is then etched, plated or otherwise processed. Finally, the flat surface is formed into the arcuate shape.

If the image surface is itself a mask, it can be used for repetitive transference of the polar-coordinate design onto other flat surfaces.

If the image surface is an arcuate shape, an additional conical mirror is placed between the projection lens and the surface to redirect the light.

DETAILED DESCRIPTION

Generally, photoetching or selective photoplating of a surface is accomplished by applying a photoresist coating to the surface to be processed and then light-exposing that portion not to be etched or plated through a corresponding transparency or mask held in close contact to the surface. The light-exposed resist is then fixed and the unexposed resist is dissolved. When the surface is immersed in an etching or plating solution, processing will take effect selectively only where the resist has been removed, thus producing a desired pattern. This process is readily accomplished where the surface to be processed is flat and close contact with a flat transparency or mask can be established. However, in the case of a non-cylindrical arcuate surface, it is difficult to conform the desired design image to any extensive area of the arcuate surface by the above-described conventional techniques.

Conformance of the design image from a conventional flat transparency or mask to an arcuate surface is accomplished in accordance with the present invention by simultaneously projecting transverse portions of the transparency or mask in a foreshortened form upon corresponding radial segments of a photoresist-coated flat surface. Subsequent processing produces a circularly distorted pattern on a flat surface, which is suitable for forming into a desired arcuate surface bearing the design without apparent distortion. The invention also contemplates projecting transverse portions directly upon a photoresist-coated arcuate surface.

Figure 1:
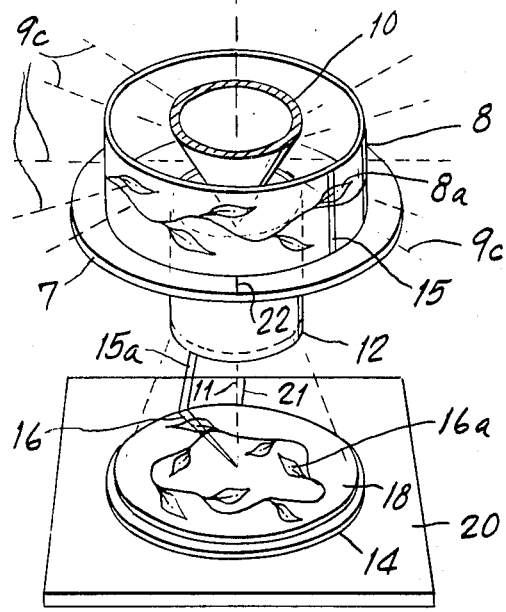
FIG. 1 is a perspective view of apparatus for projecting transverse portions of a rectangular design pattern onto corresponding radial portions of a flat image surface in accordance with the invention.
Figure 2:
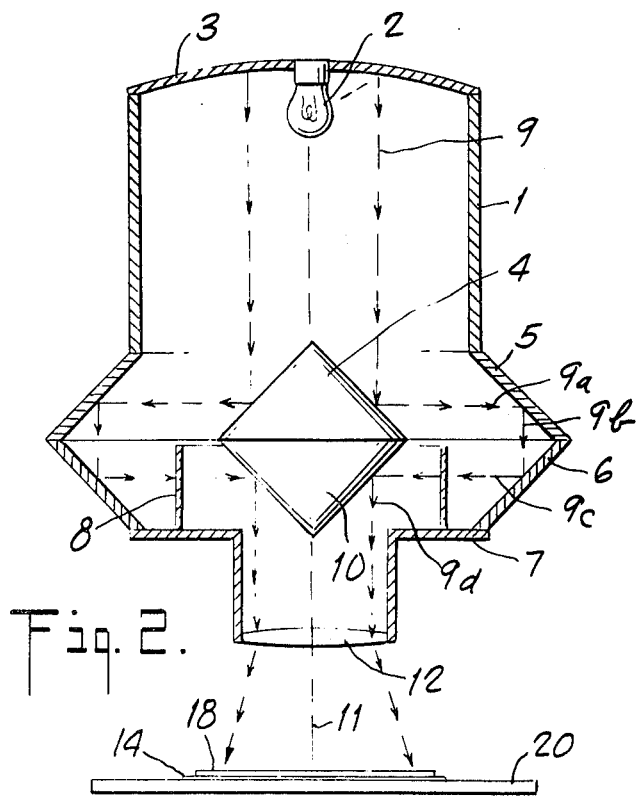
FIG. 2 is a sectional, elevational view of the apparatus for projecting a design pattern onto a flat image surface.

Referring to FIGS. 1 and 2 of the drawings, a projector or light box 1 is provided with a light source 2, a parallel ray mirrored surface 3, an outside mirrored conical surface 4, an opposing inside mirrored conical surface 5 and a second opposing inside mirrored conical surface 6. A support 7 is adapted to hold a flat, rectangular transparency or mask 8 which has been formed into a cylindrical shape having a design pattern 8a thereon. A second outside mirrored conical surface 10 is disposed along the axis 11 of the cylindrical transparency 8.

Light projected in a column 9 from the light source 2 is redirected first radially outward by mirror 4 along path 9a, next downwardly by mirror 5 along path 9b, and then radially inwardly by mirror 6 along path 9c. The light passes through cylindrical transparency 8, and is recolumnated downwardly by mirror 10 along path 9d. A lens 12 focuses the design on an image surface 14. The lens 12 may be a double convex type or any other suitable single- or multi-element lens.

Narrow transverse areas 15 of the transparency 8 simultaneously are directly in the path of the radially inwardly directed light 9c. Light and dark transverse images 15a corresponding to the pattern at the respective transverse areas 15 of the transparency 8 are thereupon projected simultaneously in the direction of the light beam axis 11. As used herein, the term "narrow transverse area" means one of the many portions of the transparency 8 which is exposed to the light similarly to the well-known projection technique of slides or photographic transparencies.

In the preferred form of the invention, the projected narrow transverse images 15a are displayed upon and received by corresponding narrow radial areas or segments 16 of a flat, substantially circular image surface 14. The surface 14 is held on a table 20 disposed perpendicular to the light beam axis 11. The flat circular surface 14 is provided with a photoresist coating 18. Portions of the coating 18 are thereby exposed to the projected images 15a. As the entire flat, circular surface 14 is simultaneously exposed at the narrow radial areas 16, an entire design pattern 16a is created on the flat circular surface 14 corresponding to the flat rectangular pattern 8a on the transparency or mask 8. However, the rectangular-coordinate design pattern 8a on the transparency 8 has been converted to a foreshortened, polar-coordinate design pattern 16a on the circular flat surface 14. The term "foreshortened," as used herein, means that the design pattern 16a is smaller in size than the design pattern 8a because the design pattern 16a is stretched when the flat surface 14 is formed into arcuate shape, e.g. a bell. The amount of foreshortening is determined empirically and depends upon the arcuate shape to be produced. For example, a cup requires a substantial amount of foreshortening; a shallow dish requires very little. If some distortion is desired or acceptable in the final shape, it may be possible to eliminate the foreshortening.

To transfer a design for subsequent etching and/or plating, the projector or light box 1 is positioned relative to the flat, circular surface 14 for desired image size and amount of foreshortening. The photoresist-coated flat, circular surface 14 is centered on the table 20 and positioned relative to the table index mark 21. A first transparency or mask 8 is positioned on the carrier or support 7 relative to the carrier index mark 22 and the lens 12 is focused upon the surface 14. The design pattern 8a comprising each of the transverse areas 15 is projected toward each of the corresponding radial segments 16 of the photoresist-coated surface 14 and the narrow transverse images 15a are exposed upon the radial segments 16. The flat, circular surface 14 is removed and processed for etching or plating in the conventional manner, for example, as in U.S. Pat. No. 3,503,815 to Johnson. To process a successive pattern, a new coating of photoresist 18 is applied to the flat, circular surface 14 and the above-described cycle is repeated. A desired etched and/or multi-finished design is thereby produced on the flat, circular surface 14.

The flat, circular surface 14 may itself be a mask, stencil or transparency. This mask or masks may then be used in mass producing a series of flat, circular surfaces suitable for forming into the desired arcuate articles. Also, the flat surface 14 need not be circular, although that configuration is useful for creating certain arcuate shapes, e.g. a bell.

Figure 3:
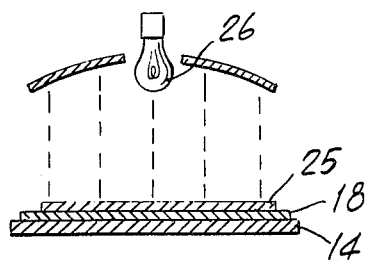
FIG. 3 is a sectional, elevational view of apparatus for exposing a photosensitized flat surface to circular patterned masks useful in the method of the invention.
Figure 4:
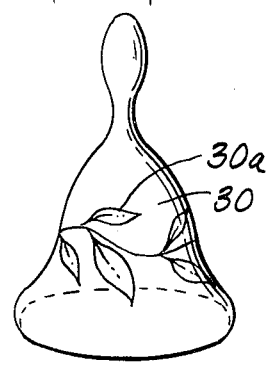
FIG. 4 is a perspective view of an arcuate surface formed in accordance with the method of the invention.

For preparing a larger number (or more than several) of the same shaped surfaces with the same designs, an expeditious mass production method desirably is employed. This modification permits the use of a simple light source and the simultaneous exposure of all areas of a flat, circular surface once the mask has been formed. As shown in FIG. 3, a flat, circular transparency or mask 25 is produced by the method shown in FIGS. 1 and 2. This mask 25 is placed over a matching flat surface 14 onto which a photosensitized coating 18 has been deposited. The transparency or mask 25 and the surface 14 are then exposed to a light source 26 and developed and fixed by conventional photographic means to produce an image on the surface. Transparency or mask sets may be used to produce successive, registered, circular design patterns on the flat, formable surface. The flat, circular surface is processed in the conventional manner by successively photoresist-coating, contact exposing, fixing or developing, and etching or plating as required. It is thereafter formed, as in FIG. 4, into the desired arcuate shape 30 bearing the desired design 30a without apparent distortion.

Masks produced in this way may also be etched through to form stencils for use in coating the arcuate surface. After positioning a stencil 25 on the arcuate surface 14, either a final or a resist coating 18 is applied by spray, brush or other deposition means. As a resist coat, subsequent processing for etching and/or plating would be carried out in the conventional manner.

Figure 5:
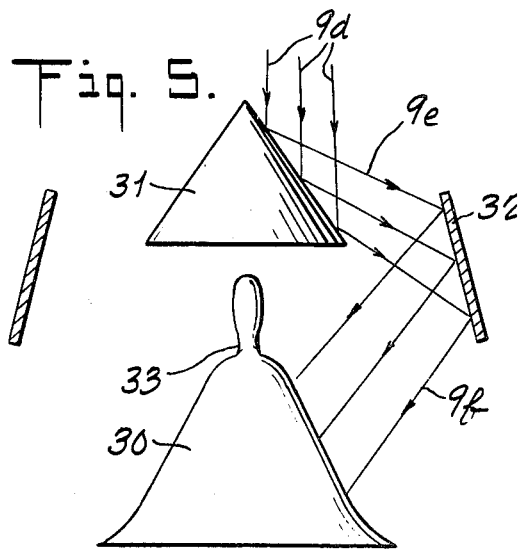
FIG. 5 is a sectional, elevational view of apparatus for redirecting the design pattern onto an outside arcuate surface.

An alternative form of the invention contemplates the transference of the design directly to an arcuate surface. This technique is useful when preparing a large number of objects having an unusual shape. FIG. 5 of the drawings shows a method of transferring a design pattern to an outside arcuate surface and is intended to be used in conjunction with the apparatus and method of FIGS. 1 and 2. An outside mirrored conical surface 31 and an inside mirrored surface 32 are interposed between the lens 12 and an arcuate surface 30 bearing a photoresist coating 33. The columnated light following the path 9d through the lens 12 strikes the conical surface 31 and is directed along path 9e toward the mirrored surface 32, which redirects the light along path 9f toward the arcuate image surface 30. The conical mirror 31 partially restores the design image to substantially rectangular-coordinate form and to right-side-up position. The angles and positions of the mirrored surfaces depend upon the arcuate shape to be produced and the size thereof so that the light strikes the arcuate surface substantially perpendicular thereto. Thus, narrow transverse images 15a projected from the transparency 8 are received directly and exposed upon the photoresist coated arcuate surface.

Figure 6:
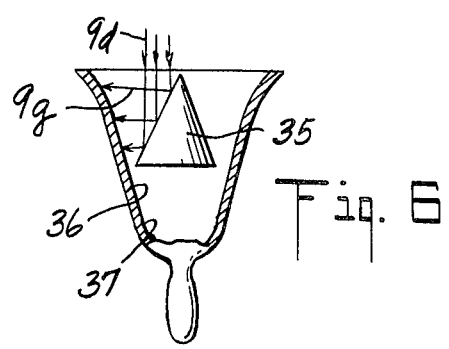
FIG. 6 is a sectional, elevational view of apparatus for redirecting the design pattern onto an inside arcuate surface.

FIG. 6 shows a similar method for transferring the design onto an inside arcuate surface. An outside mirrored conical surface 35, which partially restores the design image to substantially rectangular-coordinate form, is placed between the lens 12 and an inside arcuate surface 36 having a photoresist coating 37. Columnated light folliwing the path 9d through the lens 12 is redirected by the mirrored surface 35 along path 9g toward the arcuate image surface 36. The narrow transverse images 15a projected from the transparency 8 are exposed directly upon the photoresist coated inside arcuate surface.

The above descriptions are intended to be illustrative of methods for conforming a flat, rectangular-coordinate design pattern to a corresponding polar-coordinate flat design pattern suitable for formation into a desired arcuate surface bearing the design in proper proportion without apparent distortion. Alternatively, the design may be transferred directly to an arcuate surface without apparent distortion. The present invention has substantial use in the production of bowls, bells, jewelry and other decorated items having an arcuate or other irregular surface. The word "arcuate," as used herein, is intended to mean irregular, non-flat surfaces of various sizes and shapes. Many other uses of the invention will be apparent to those working in this and related fields.

I claim:

1. A method of producing a polar-coordinate design on a flat image surface from a rectangular-coordinate design, comprising:
    (a) forming the design in undistorted rectangular-coordinate form upon a flat transparency;
    (b) forming the flat transparency into a cylindrical shape;
    (c) simultaneously exposing images of the transparency to radially and inwardly directed light;
    (d) redirecting the light passing through the transparency perpendicular to the radial light paths whereby corresponding images of the design are projected in a column and in polar-coordinate form;
    (e) providing the flat image surface with a photosensitive coating;
    (f) disposing the flat image surface substantially perpendicular to the light in the column and with its center coincident with the axis of the columnated projection, such that the design image is exposed in distorted polar-coordinate form upon the photosensitized image surface; and
    (g) processing the exposed coating on the flat image surface to selectively produce the design upon the surface.

2. A method according to claim 1 further comprising repeating each of the steps thereof to produce a second design upon the image surface.

3. A method according to claim 1 further comprising forming said flat image surface into an arcuate surface bearing the design restored to relatively undistorted, rectangular-coordinate disposition in arcuate form.

4. A method according to claim 1 further comprising:
    (h) applying the flat image surface bearing the polar-coordinate design to a flat base of substantially the same dimensions;
    (i) providing the flat base with a photosensitive coating;
    (j) exposing the flat image surface and the flat base to a light source to transfer the design from the flat image surface to the flat base; and
    (k) processing the exposed coating on the flat base to produce the design thereon.

5. A method according to claim 4 further comprising forming said flat base into an arcuate surface bearing the design restored to relatively undistorted, rectangular-coordinate disposition in arcuate form.

6. A method of transferring a design from a flat form to a surface, comprising simultaneously projecting undistorted image areas of the design inwardly and in a radial direction from a flat rectangular transparency formed into a cylindrical shape, and redirecting the path of projection substantially perpendicular to the radial projection path such that the design image areas are projected in distorted form toward the surface.

7. A method according to claim 6 further comprising redirecting the path of projection from the surface such that the design image areas are projected upon and received by corresponding areas of an arcuate image surface in relatively undistorted form.

8. A method of transferring a design from a flat rectangular-coordinate form to an image surface, comprising projecting images of the design radially from a flat rectangular-coordinate surface formed into a cylindrical shape by exposing the images to radially directed light, and redirecting the path of projection substantially perpendicular to the radii of the cylindrical shape such that the design images are projected upon and received by corresponding areas of the image surface.

9. A method according to claim 8, wherein the design images are projected simultaneously.

10. A method according to claim 8, wherein the image surface is a flat surface and the design is received thereon in polar-coordinate form.

11. A method according to claim 8, wherein the image surface is an arcuate surface and the design is received thereon in relatively undistorted, rectangular-coordinate form.

12. A method according to claim 8, wherein the image surface is a flat surface, and further comprising forming the flat surface into an arcuate shape bearing the design in relatively undistorted, rectangular-coordinate form.

13. A method according to claim 8, further comprising repeating each of the steps thereof to produce a second design upon the image surface.

* * * * *